US012743217B2

(12) United States Patent
Park et al.

(10) Patent No.: US 12,743,217 B2
(45) Date of Patent: Sep. 22, 2026

(54) PROCESSING-IN-MEMORY DEVICE BASED ON RESISTIVE MEMORY AND METHOD THEREOF

(71) Applicant: KOREA UNIVERSITY RESEARCH AND BUSINESS FOUNDATION, Seoul (KR)

(72) Inventors: Jongsun Park, Seoul (KR); Yunho Jang, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 18/961,689

(22) Filed: Nov. 27, 2024

(65) Prior Publication Data

US 2025/0173072 A1 May 29, 2025

(30) Foreign Application Priority Data

Nov. 28, 2023 (KR) ........................ 10-2023-0167382
Mar. 7, 2024 (KR) ........................ 10-2024-0032407

(51) Int. Cl.

| | |
|---|---|
| ***G06F 3/06*** | (2006.01) |
| ***G11C 11/54*** | (2006.01) |
| *G11C 5/14* | (2006.01) |
| *G11C 11/418* | (2006.01) |

(52) U.S. Cl.
CPC .......... *G06F 3/0625* (2013.01); *G06F 3/0659* (2013.01); *G06F 3/0673* (2013.01); *G11C 11/54* (2013.01); *G11C 5/147* (2013.01); *G11C 11/418* (2013.01)

(58) Field of Classification Search
CPC . G11C 11/54; G11C 11/4096; G11C 11/4074; G11C 11/4085; G11C 11/4094; G11C 11/418; G11C 11/419; G11C 5/147; G11C 7/04; G11C 8/08
See application file for complete search history.

(56) References Cited

U.S. PATENT DOCUMENTS 9,349,440 B1 * 5/2016 Ma ..................... G11C 13/0069
10,970,441 B1 * 4/2021 Zhang ................... G06F 30/327
(Continued)

FOREIGN PATENT DOCUMENTS

CN 118333119 A * 7/2024 ............. G11C 7/106
KR 10-2298607 B1 9/2021
KR 10-2023-0020274 A 2/2023

OTHER PUBLICATIONS

CN118333119A translation and original: published Jul. 12, 2024. (Year: 2024).*

(Continued)

*Primary Examiner* — Mushfique Siddique
(74) *Attorney, Agent, or Firm* — Hauptman Ham, LLP

(57) ABSTRACT

Disclosed is a processing-in-memory device based on a resistive memory, which includes at least one local array, and an input operation unit that re-sets an input value based on a predicted value with respect to an operation of the local array and applies the re-set input value to the local array, and the local array includes at least one weight cell that stores a plurality of weights, and a charge domain cell that converts the stored weights into voltage values based on the re-set input value.

11 Claims, 8 Drawing Sheets

(56) References Cited

U.S. PATENT DOCUMENTS

| | | | | |
|---|---|---|---|---|
| 2009/0024816 | A1* | 1/2009 | Thibadeau | G06F 3/068<br>711/E12.001 |
| 2019/0042160 | A1* | 2/2019 | Kumar | G06F 3/0659 |
| 2022/0075599 | A1* | 3/2022 | Hu | G11C 7/1006 |
| 2022/0156045 | A1* | 5/2022 | Nazar | G06F 7/523 |
| 2022/0351032 | A1* | 11/2022 | Chou | G11C 11/54 |
| 2023/0370082 | A1* | 11/2023 | Lee | G11C 11/419 |
| 2023/0395132 | A1* | 12/2023 | Park | G11C 7/18 |
| 2024/0061649 | A1* | 2/2024 | Kwon | G11C 7/1006 |
| 2024/0296887 | A1* | 9/2024 | Yuh | G11C 11/161 |
| 2025/0156149 | A1* | 5/2025 | Yang | G06F 17/16 |

OTHER PUBLICATIONS

Office Action dated May 15, 2026, for the corresponding Korean Patent Application No. 10-2024-0032407, along with an English translation (Total 18 pages).

* cited by examiner

FIG. 1

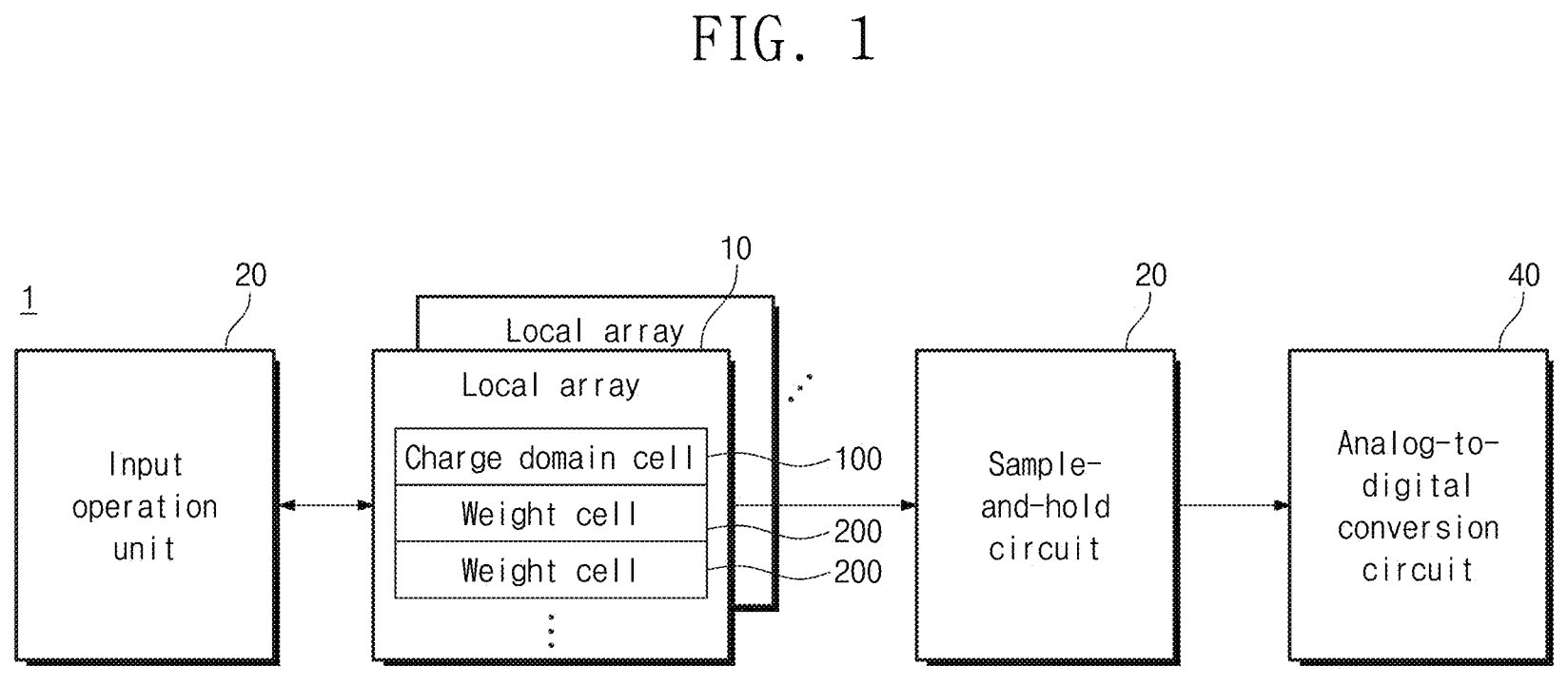

1
Input operation unit
20
Local array
Local array
10
Charge domain cell
Weight cell
Weight cell
100
200
200
Sample-and-hold circuit
20
Analog-to-digital conversion circuit
40

MSB
LSB
S&H
S&H1
S&H2
A single ADC
(a)
(b)

PROCESSING-IN-MEMORY DEVICE BASED ON RESISTIVE MEMORY AND METHOD THEREOF

CROSS-REFERENCE TO RELATED APPLICATIONS

This application claims priority under 35 U.S.C. § 119 to Korean Patent Application No. 10-2023-0167382 filed on Nov. 28, 2023 and Korean Patent Application No. 10-2024-0032407 filed on Mar. 7, 2024, in the Korean Intellectual Property Office, the disclosures of which are incorporated by reference herein in their entireties.

BACKGROUND

Embodiments of the present disclosure described herein relate to a processing-in-memory device based on a resistive memory capable of charge domain operations and an operating method thereof.

With the development of artificial neural networks that achieve high accuracy, the number of multiplication-accumulation operations required is increased, which causes a huge amount of data movement between a processor and a memory. Due to this, energy consumption for data movement as well as operations is emerged as an important issue that should be resolved.

However, it is very energy inefficient to process many operations and massive data movements in the conventional computer structure. Therefore, a memory technology called Processing-in-Memory (PIM) is developed. The processing-in-memory supports existing read/write operations and additionally supports computational functions within the memory to resolve energy consumption due to data movement. Among them, the processing-in-memory using non-volatile resistive memory such as a ReRAM, an MRAM, and a PCRAM may store all weights of an artificial neural network with a small area even when there is no power. Therefore, the processing-in-memory based on the resistive memory eliminates weight data movement and enables efficient multiplication-accumulation operations using the current summation technique within the memory. However, when the processing-in-memory based on the resistive memory is actually manufactured as a chip, it is difficult to perform reliable operations due to process variations that occur.

In order for the processing-in-memory based on the resistive memory to perform reliable operations, the number of row lines activated during operations should be reduced. Accordingly, as the number of active word lines decreases, the amount of multiplication-accumulation operations performed per cycle decreases. Since the number of times the word lines are activated by accessing the resistive memory increases by the reduced number of operations, there is an issue that the multiplication-accumulation operation speed and energy efficiency are reduced.

SUMMARY

Embodiments of the present disclosure provide a processing-in-memory device based on a resistive memory capable of charge domain operations and an operating method thereof.

According to an embodiment of the present disclosure, a processing-in-memory device based on a resistive memory includes at least one local array, and an input operation unit that re-sets an input value based on a predicted value with respect to an operation of the local array and applies the re-set input value to the local array, and the local array includes at least one weight cell that stores a plurality of weights, and a charge domain cell that converts the stored weights into voltage values based on the re-set input value.

According to an embodiment, the weight cell may include a resistive memory, and the charge domain cell may include a static random access memory (SRAM) of a latch structure.

According to an embodiment, the local array may perform a multiplication-accumulation operation by charge sharing source line voltage values of the charge domain cell.

According to an embodiment, the processing-in-memory device may further include at least one sample and hold circuit that stores a result value of the multiplication-accumulation operation, and an analog-to-digital conversion circuit that charge-shares the result values stored in the at least one sample and hold circuit and converts the result values into digital values.

According to an embodiment, the predicted value may be a result of performing the multiplication-accumulation operation on the weight and the input value, and the input operation unit, when the predicted value is “0”, may re-set the input value to “0”.

According to an embodiment, the at least one weight cell may store a weight based on a weight pattern of a filter among the plurality of weights, and when the weight pattern is repeated among the plurality of weights, may remove the weight.

According to an embodiment, the input operation unit may add at least one input value that is multiplied by the weight according to the weight pattern, and may apply the added input value to the local array.

According to an embodiment of the present disclosure, a method of operating a processing-in-memory device based on a resistive memory, includes storing a plurality of weights, re-setting an input value based on a predicted value with respect to an operation of a local array, applying the re-set input value to the local array, converting the stored weight into a voltage value based on the re-set input value, performing a multiplication-accumulation operation by charge sharing the voltage value, storing a result value of the multiplication-accumulation operation, and charge sharing the stored result values and converting the result values into digital values.

According to an embodiment, the predicted value may be a result of performing the multiplication-accumulation operation on the weight and the input value, and the re-setting of the input value may include, when the predicted value is “0”, re-setting the input value to “0”.

According to an embodiment, the storing of the plurality of weights may include storing a weight based on a weight pattern of a filter among the plurality of weights, and removing the weight when the weight pattern is repeated among the plurality of weights.

According to an embodiment, the applying of the re-set input value to the local array may further include adding at least one input value that is multiplied by the weight according to the weight pattern, and applying the added input value to the local array.

BRIEF DESCRIPTION OF THE FIGURES

The above and other objects and features of the present disclosure will become apparent by describing in detail embodiments thereof with reference to the accompanying drawings.

FIG. 1 is a block diagram of a processing-in-memory device based on a resistive memory, according to an embodiment of the present disclosure.

DETAILED DESCRIPTION

Hereinafter, embodiments of the present disclosure will be described with reference to the accompanying drawings in order to describe the technical idea of the present disclosure in detail to the extent that those skilled in the art can easily carry out it.

Figure 2A:
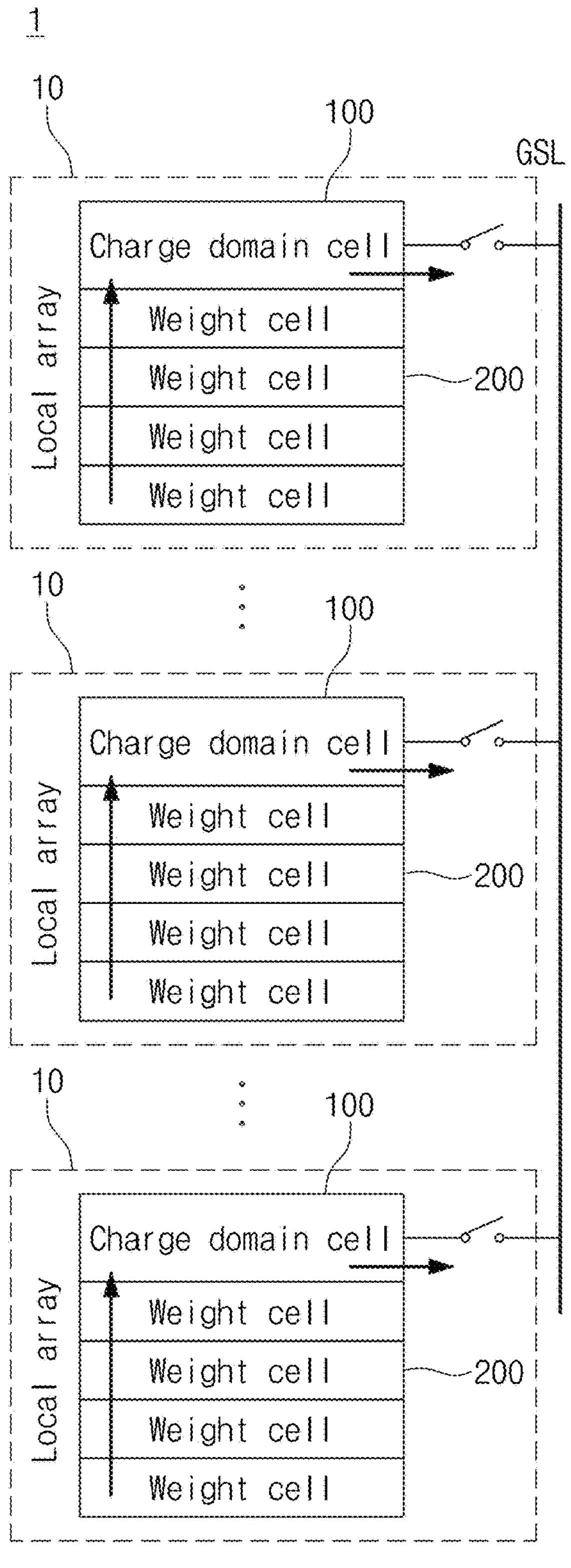
FIGS. 2A and 2B are diagrams illustrating examples of a local array, according to an embodiment of the present disclosure.
Figure 2B:
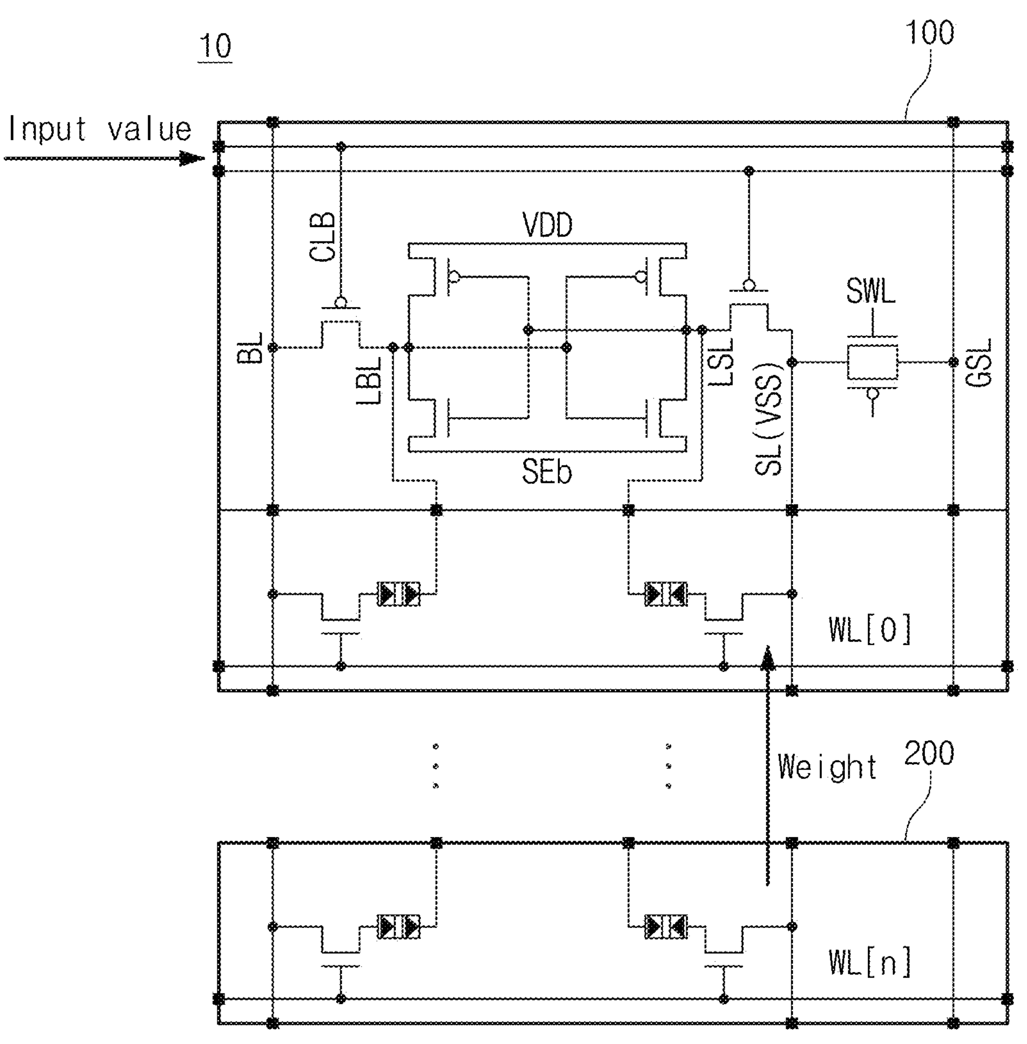

FIG. 1 is a block diagram of a processing-in-memory device 1 based on a resistive memory, according to an embodiment of the present disclosure, and FIGS. 2A and 2B are examples of a local array 10, according to an embodiment of the present disclosure.

Referring to FIG. 1, the processing-in-memory device 1 may include the local array 10, an input operation unit 20, a sample-and-hold circuit 30, and an analog-to-digital conversion circuit 40.

The processing-in-memory device 1 may be composed of multiple local arrays 10, and one local array 10 is composed of multiple weight cells 200 and one charge domain cell 100.

Referring to FIGS. 2A and 2B, the charge domain cell 100 may convert a stored weight into a voltage value based on a re-set input value. The charge domain cell 100 may include a static random access memory (SRAM) of a latch structure. The voltage value obtained by converting the weight through the charge domain cell 100 may be subject to charge-based operations.

At least one or more weight cells 200 may store a plurality of weights. The weight cell 200 may include a resistive memory, and may include a high-density resistive memory with a large capacity. However, this is only an example and is not limited thereto.

Referring again to FIG. 2B, when the weight cell 200 stores the weight '1', the left element of the weight cell 200 may be in a low resistance state and the right element of the weight cell 200 may be in a high resistance state. By pre-charging an LBL (Local Bit Line) and an LSL (Local Source Line) of the charge domain cell 100 with a voltage VDD, current may be supplied to the two elements. When the currents applied to the two elements are significantly different, the charge domain cell 100 may sense a resistance state of the elements by applying a voltage VSS to an SEb (Sensing Enable signal Bar) and may convert the weight into the voltage value. When the right element of the charge domain cell 100 has high resistance, the voltage of the LSL may be the voltage VDD. Thereafter, a voltage corresponding to a 1-bit input value may be applied to a CL (Computing Line) of the charge domain cell 100, and a 1-bit X 1-bit operation may be performed. In addition, the charge domain cell 100 may store a multiplication result value in an SL (Source Line).

Afterwards, the local array 10 may perform a multiplication-accumulation operation by sharing the voltage value of the source line SL of the charge domain cell 100. After this, a GSL (Global Source Line) voltage may be an accumulated value of the multiplication result values. In this case, the charge sharing means that when two capacitors with different charge amounts are connected to a transistor, and when current flows through the transistor, the charge of the capacitor with a large charge amount is divided into the capacitor with a small charge amount to achieve balance.

The weight cell 200 may store a weight based on the weight pattern of a filter among multiple weights. In detail, the weight cell 200 may remove the weight when the weight pattern is repeated. In this case, the filter is a filter that sets a weight pattern by a row-wise weight compression technique and may be stored in the weight cell 200. A detail description of this will be described later in the description of FIG. 4A.

The input operation unit 20 may re-set an input value based on a predicted value with respect to the operation of the local array 10 and may apply the re-set input value to the local array 10. In this case, the predicted value may be the result of performing the multiplication-accumulation operation on the weight and the input value.

The input operation unit 20 may re-set the input value to "0" when the predicted value is "0".

The input operation unit 20 may add at least one input value that is multiplied by the weight according to the weight pattern. The input operation unit 20 may apply the added input value to the local array 10.

The sample-and-hold circuit 30 may store the result value of the multiplication-accumulation operation.

The analog-to-digital conversion circuit 40 may charge-share the result values stored in the sample-and-hold circuit 30 and may convert the result values into digital values.

As described above, in the local array 10, the characteristics of the SRAM with a large single area but high operation reliability and the characteristics of the resistive memory with a small single area may be combined.

The local array 10 may minimize the increase in area, and the operation reliability may be increased since the multiplication-accumulation operation is performed in the charge domain that is widely used in the SRAM. The high-reliability operation may increase the amount of operations performed per cycle in the PIM structure, and as a result, the operation speed and energy efficiency may be improved.

Figure 3:
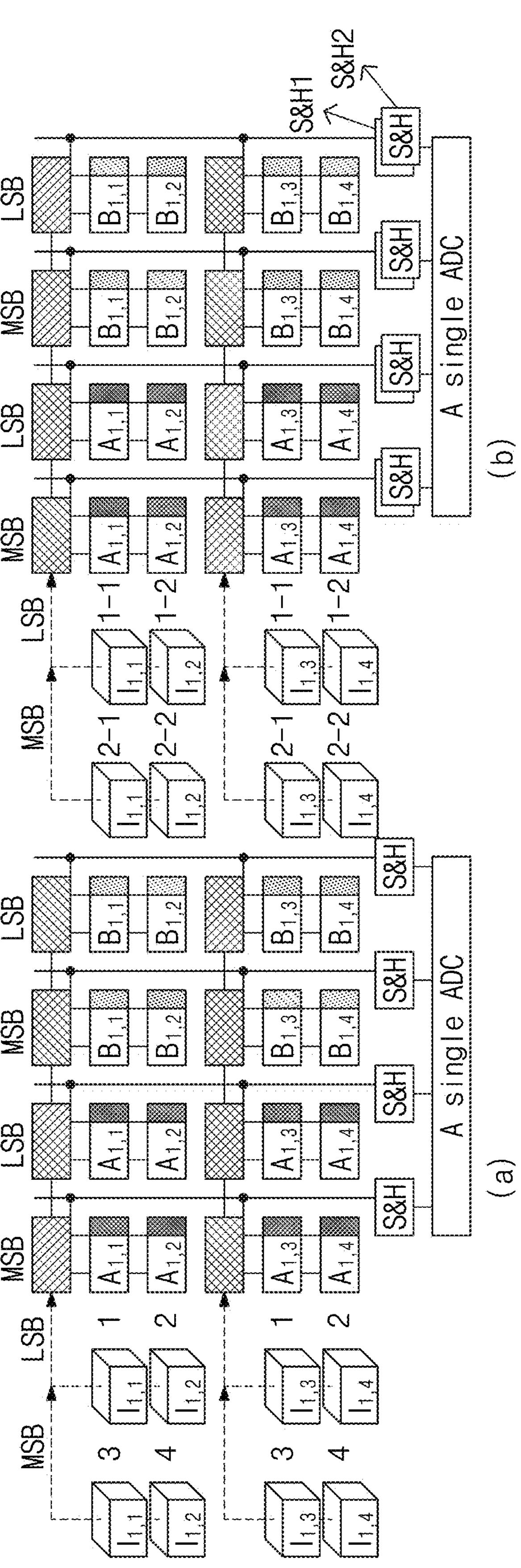
FIG. 3 is a diagram illustrating an example of an operation of a local array, according to an embodiment of the present disclosure.

FIG. 3 is an example of an operation of the local array 10, according to an embodiment of the present disclosure.

Referring to FIG. 3, when the number of activatable row lines is less than the number of local arrays 10 present in one row, the structure illustrated in (a) of FIG. 3 may be used. In contrast, when the number of activatable row lines is greater than the number of local arrays 10, the structure illustrated in (b) of FIG. 3 may be used. In this case, an MSB (Most Significant Bit) may mean the most significant bit of data, and an LSB (Least Significant Bit) may mean the least significant bit of data.

For example, in the (a) structure, for the multiplication-accumulation operation of I1,1 to I1,4 and A1,1 to A1,4, B1,1 to B1,4, the LSB of I1, 1 and I1,3 may be inputted first into the local array 10. Afterwards, the analog voltage value, which is the result value of performing the multiplication-accumulation operation, may be stored in the sample-and-hold circuit 30. Afterwards, the analog-to-digital conversion circuit 40 may convert the result values stored in the sample-and-hold circuit 30 into digital values.

Meanwhile, in the (b) structure, the LSB of I1,1 and I1,3 may be inputted into the local array 10. Afterwards, the result value of the multiplication-accumulation operation may be stored in the first sample-and-hold circuit 30. In this case, the analog-to-digital conversion circuit 40 may not operate immediately, and I1,2 and I1,4 may be input directly, and the result values of the multiplication-accumulation operation may be stored in the second sample-and-hold circuit 30. After the voltages stored in the first and second sample-and-hold circuits 30, i.e., the result values, are charge-shared, the result values may be converted into digital values all at once through the analog-to-digital conversion circuit 40.

As described above, the processing-in-memory device 1 based on the resistive memory, according to the embodiment of the present disclosure may improve reliability as it performs operations in the charge domain. In detail, the processing-in-memory device 1 based on the resistive memory, according to the embodiment of the present disclosure may activate many word lines at once, thereby improving operation energy efficiency and operation processing speed.

In addition, the processing-in-memory device 1 based on the resistive memory, according to the embodiment of the present disclosure may alleviate the conventional area overhead issue by using the weight compression technique.

Figure 4A:
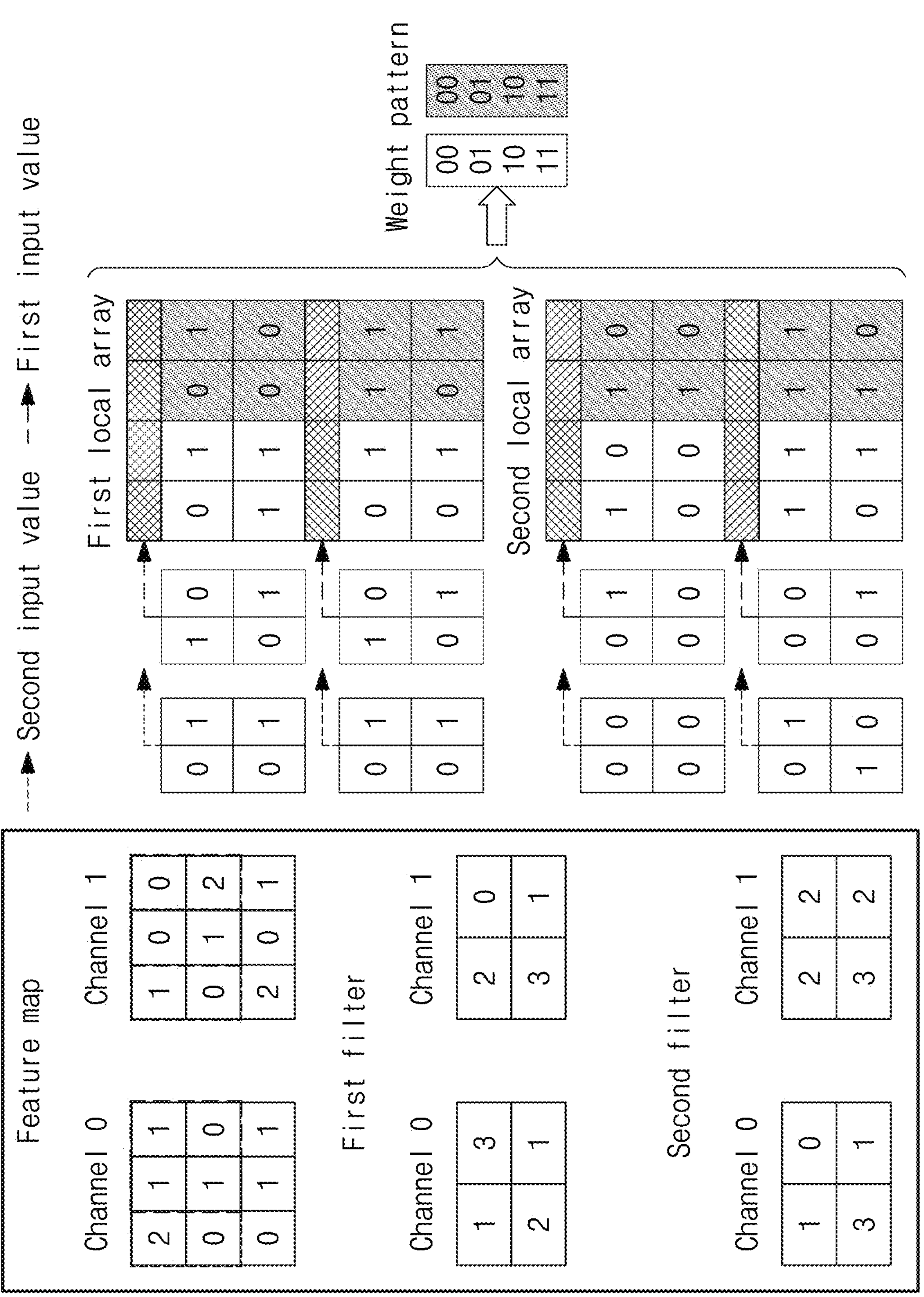
FIGS. 4A and 4B are diagrams illustrating examples of an operation of a weight cell, according to an embodiment of the present disclosure.
Figure 4B:
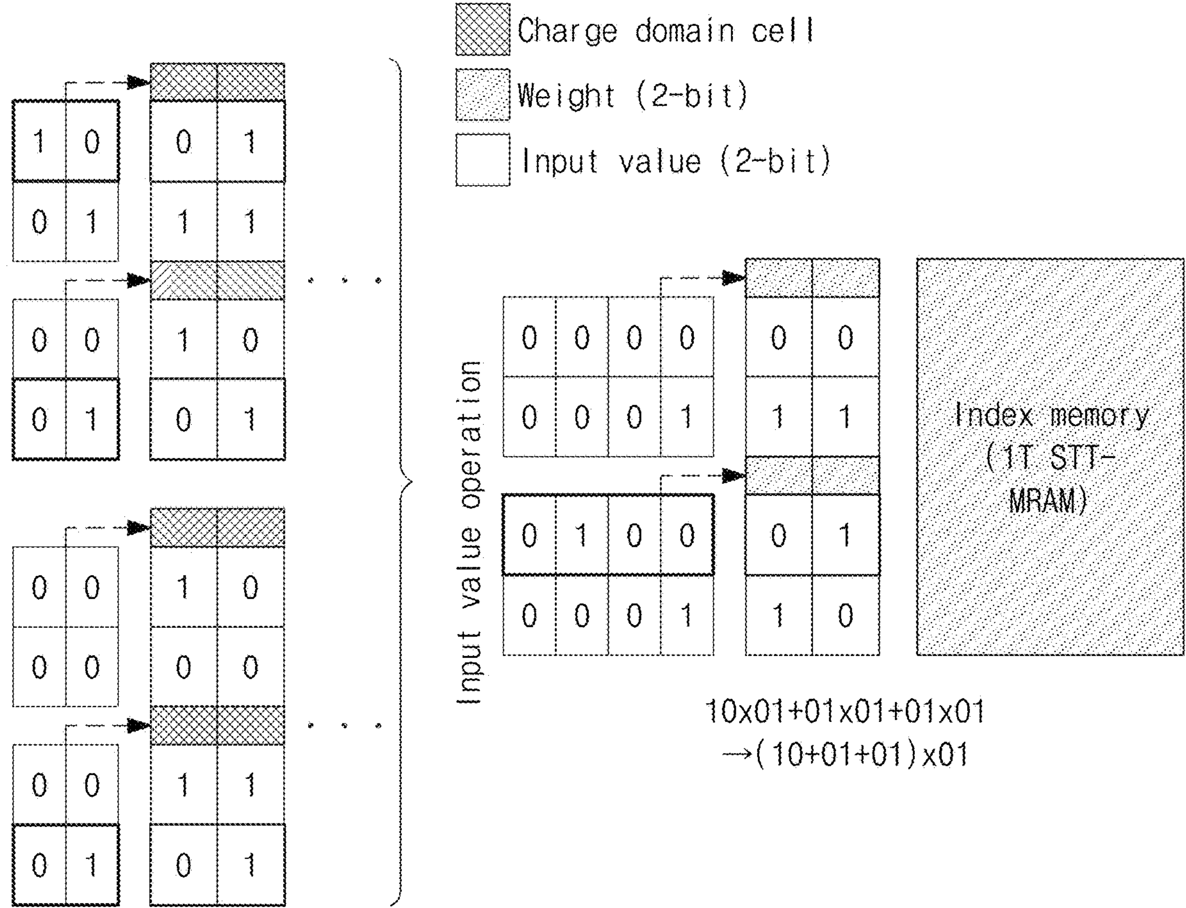

FIGS. 4A and 4B are examples of an operation of the weight cell 200, according to the embodiment of the present disclosure.

Referring to FIG. 4A, the processing-in-memory device 1 according to the embodiment of the present disclosure has an issue in that the area increases due to the charge domain cell 100. To solve this issue, the row-wise weight compression technique may be applied to the weight cell 200. The row-wise weight compression technique is a technique that compresses one filter stored in the memory in the row direction into only a 2N (when the weight is N-bit) pattern. To perform the operation without error even after compressing the weights, before inputting the input values into the local array 10, the weight cell 200 may first add the input values that should be multiplied by the weights of the same pattern. In this case, information on the pattern relationship between the input values and the weights may be stored in a general high-density resistive memory. As a result, only a few weight patterns may be stored in the weight cell 200 with a large area, and many input value indexing information may be stored in the high-density resistive memory, so the size of the area overhead may be significantly reduced.

In the row-wise weight compression technique, only one pattern among the weights inside one filter may be stored in the weight cell 200, and the rest may be removed. For example, in the case of a filter with eight 2-bit weights, only four weight patterns, 00, 01, 10, and 11, may be stored in the weight cell 200, and the rest may be removed. For reference, since the weights within the same filter are mapped to the memory in the row direction, it may be called the row-wise weight compression technique.

However, since this compression technique may cause an error in the operation, before the input value is input to the charge domain cell 100, the input operation unit 20 may first add the input values to be multiplied by the same weight. Referring to FIG. 4B, a first input value to be multiplied by 01 of a first filter is 10, 01, and 01, and may be first accumulated as one of the three input values described above and may be input to the local array 10. Accordingly, the amount of weight data may be further reduced by using not only the row-wise weight compression technique but also a weight sharing technique. When the row-wise weight compression technique is used, since the weight patterns of all filters stored in the local array 10 are the same, only the weight patterns of one filter may be left within one local array 10 and the rest may be shared to further compress the weights.

Figure 5:
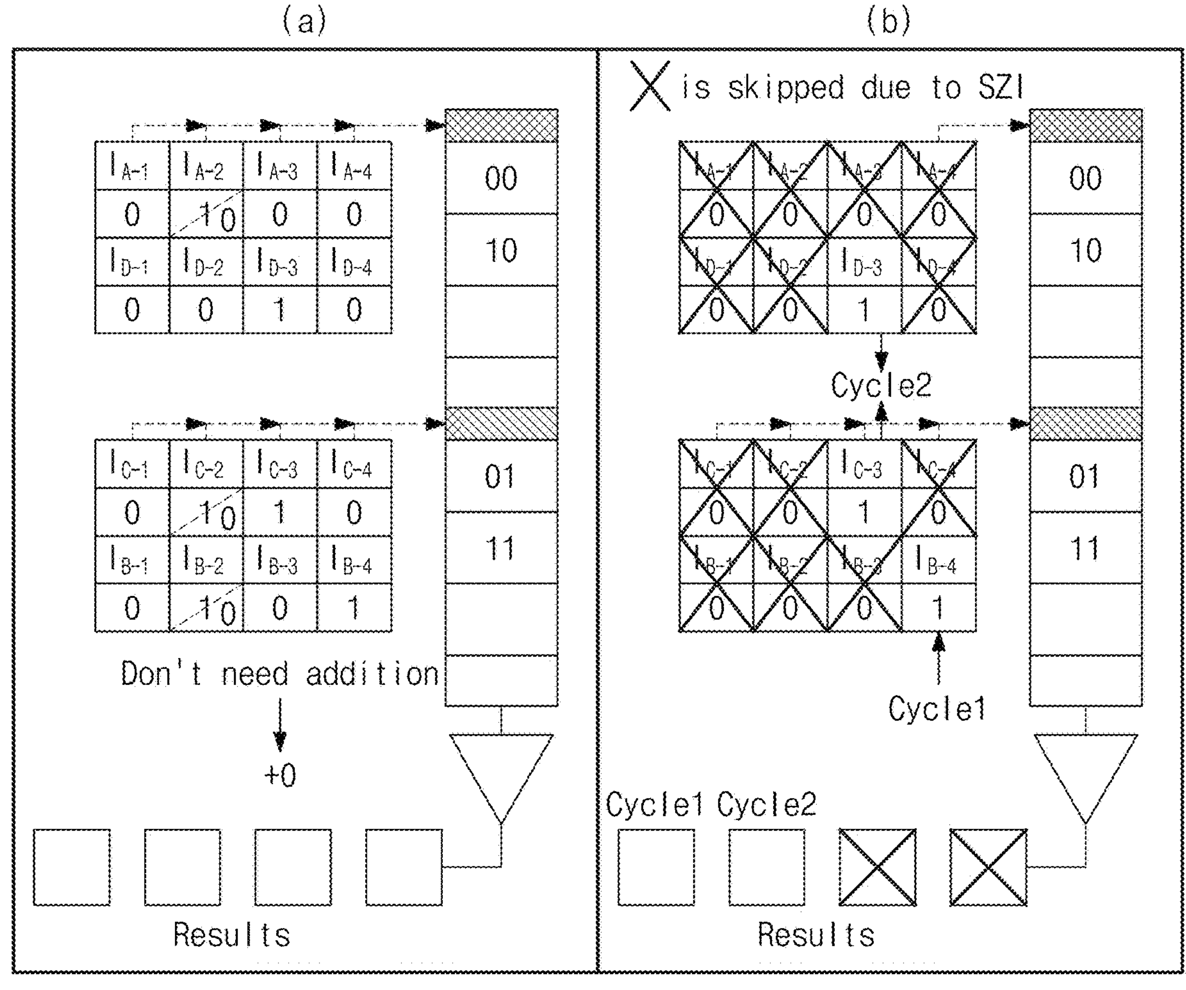
FIG. 5 is a diagram illustrating an example of an operation of an input operation unit, according to an embodiment of the present disclosure.

FIG. 5 is an example of an operation of the input operation unit 20, according to an embodiment of the present disclosure.

Considering that the weight cell 200 may be fixed due to the row-wise weight compression technique and that a limited weight pattern may be stored in the local array 10, the input operation unit 20 may use the zero-conversion technique and the zero-skipping technique.

In the zero-conversion technique, input values whose results are '0' may be predicted by performing the multiplication-accumulation operations with the weight in the local array 10. The prediction result may be made into a '0' value before being input into the local array 10. Referring to FIG. 5, both IC-2 and IB-2 are '1', not '0', but each of them may be applied to the local array 10 to perform a 1X01+1X11 operation. Accordingly, the operation result may be '0'. Since there is no need to perform the operation when the result value is '0', the input operation unit 20 may convert both input IC-2 and IB-2 to '0'. In this way, the input operation unit 20 may increase the ratio of '0' by using the zero conversion technique. In addition, the input operation unit 20 may apply the zero skip technique to input values with a high ratio of '0' based on this. Accordingly, the operation speed and energy efficiency of the local array 10 may be improved.

Figure 6:
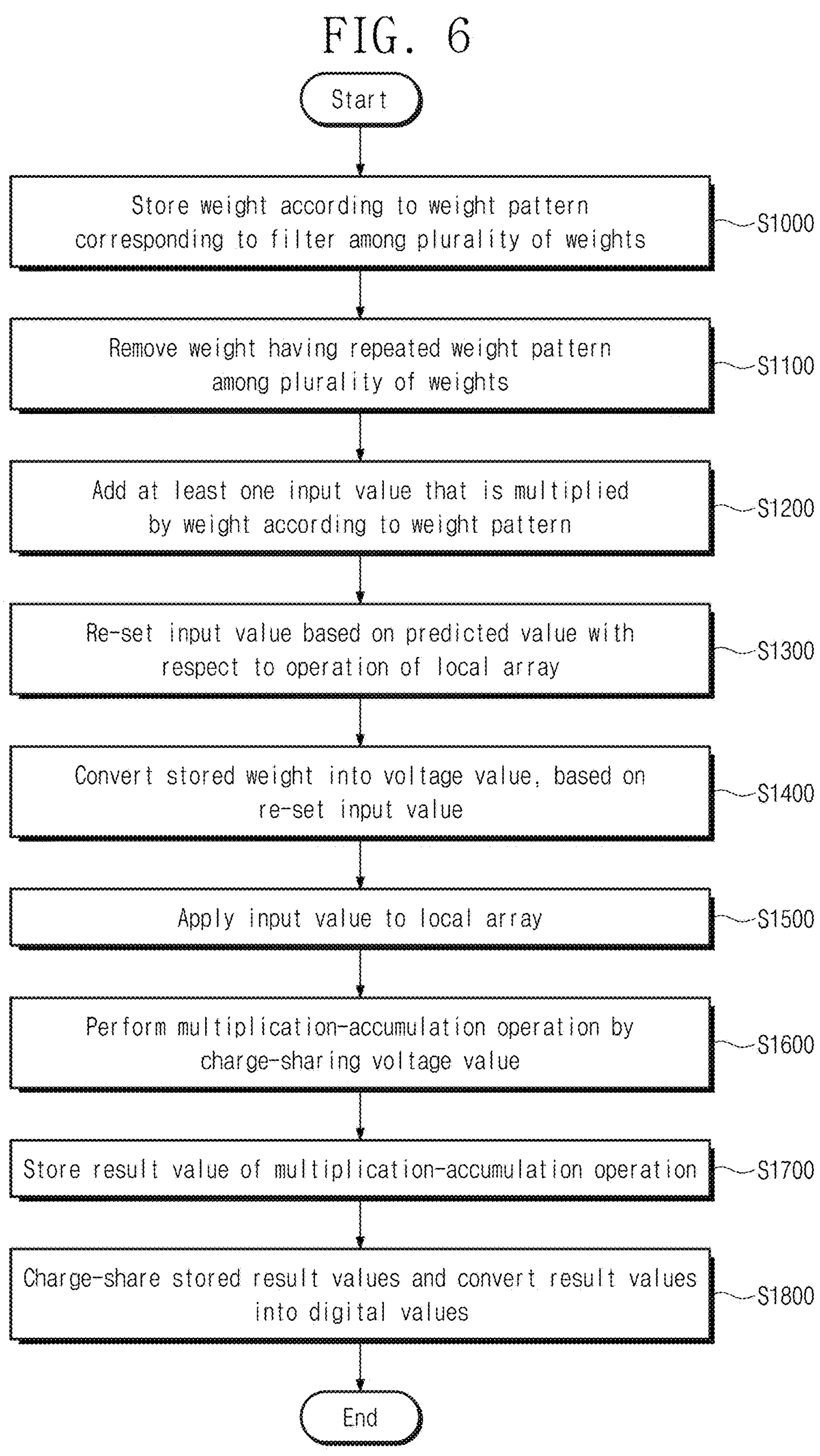
FIG. 6 is a flowchart illustrating an operation method of a processing-in-memory device based on a resistive memory, according to an embodiment of the present disclosure.

FIG. 6 is a flowchart of an operation method of the processing-in-memory device 1 based on the resistive memory, according to an embodiment of the present disclosure.

Referring to FIG. 6, in operation S1000, a weight according to a weight pattern corresponding to a filter may be stored among a plurality of weights. For example, the weight cell 200 of FIG. 1 may store a weight according to a weight pattern corresponding to a filter among the plurality of weights.

In operation S1100, a weight having a repeated weight pattern may be removed among the plurality of weights. For example, the weight cell 200 may remove the weight having a repeated weight pattern among the plurality of weights.

In operation S1200, at least one input value that is multiplied by the weight according to the weight pattern may be added. For example, the input operation unit 20 may add at least one input value that is multiplied by the weight according to the weight pattern.

In operation S1300, an input value may be re-set based on a predicted value with respect to an operation of the local array 10. For example, the input operation unit 20 of FIG. 1 may re-set the input value based on the predicted value with respect to the operation of the local array 10. The input operation unit 20 may apply the zero-conversion technique and the zero-skipping technique to the input value. The input operation unit 20 may re-set the input value to "0" when the predicted value is "0". In this case, the predicted value may be the result of performing the multiplication-accumulation operation on the weight and the input value.

In operation S1400, the stored weight may be converted into a voltage value, based on the re-set input value. The charge domain cell 100 of FIG. 1 may convert the stored weight into a voltage value, based on the re-set input value.

In operation S1500, the input value may be applied to the local array 10. For example, the input operation unit 20 may apply the re-set input value or the added input value to the local array 10.

In operation S1600, the multiplication-accumulation operation may be performed by charge-sharing the voltage value. For example, the local array 10 may perform the multiplication-accumulation operation by charge-sharing the voltage value.

In operation S1700, a result value of the multiplication-accumulation operation may be stored. For example, the sample-and-hold circuit 30 may store the result value of the multiplication-accumulation operation.

In operation S1800, the stored result values may be charge-shared, and the result values may be converted into digital values. For example, the analog-to-digital conversion circuit 40 may charge-share the stored result values, and may convert the result values into digital values.

As described above, the operation method of the processing-in-memory device based on the resistive memory according to the embodiment of the present disclosure may improve reliability since operations in the charge domain are performed. In detail, the operation method of the processing-in-memory device based on the resistive memory according to the present disclosure may activate many word lines at once, thereby improving operation energy efficiency and operation processing speed.

In addition, the operation method of the processing-in-memory device based on a resistive memory according to the embodiment of the present disclosure may alleviate the conventional area overhead problem by using the weight compression technique.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. Therefore, the scope of the present disclosure should not be limited to the above-described embodiments and should be defined by not only the claims to be described later, but also those equivalent to the claims of the present disclosure.

What is claimed is:

1. A processing-in-memory device based on a resistive memory, the processing-in-memory device comprising:
 at least one local array; and
 an input operation unit configured to re-set an input value based on a predicted value with respect to an operation of the local array and to apply the re-set input value to the local array, and
 wherein the local array includes:
 at least one weight cell configured to store a plurality of weights; and
 a charge domain cell configured to convert the stored weights into voltage values based on the re-set input value, and
 wherein the operation of the local array is skipped based on the re-set input value.

2. The processing-in-memory device of claim 1, wherein the weight cell includes the resistive memory, and
 wherein the charge domain cell includes a static random access memory (SRAM) of a latch structure.

3. The processing-in-memory device of claim 2, wherein the at least one weight cell is configured to:
 store a weight based on a weight pattern of a filter among the plurality of weights; and
 when the weight pattern is repeated among the plurality of weights, remove the weight.

4. The processing-in-memory device of claim 3, wherein the input operation unit is configured to:
 add at least one input value that is multiplied by the weight according to the weight pattern; and
 apply the added input value to the local array.

5. The processing-in-memory device of claim 1, wherein the local array is configured to perform a multiplication-accumulation operation by charge sharing source line voltage values of the charge domain cell.

6. The processing-in-memory device of claim 5, further comprising:
 at least one sample and hold circuit configured to store a result value of the multiplication-accumulation operation; and
 an analog-to-digital conversion circuit configured to charge-share the result values stored in the at least one sample and hold circuit and to convert the result values into digital values.

7. The processing-in-memory device of claim 5, wherein the predicted value is a result of performing the multiplication-accumulation operation on the weight and the input value, and
 wherein the input operation unit, when the predicted value is "0", is configured to re-set the input value to "0".

8. A method of operating a processing-in-memory device based on a resistive memory, the method comprising:
 storing a plurality of weights;
 re-setting an input value based on a predicted value with respect to an operation of a local array;
 applying the re-set input value to the local array;
 converting the stored weight into a voltage value based on the re-set input value;
 performing a multiplication-accumulation operation by charge sharing the voltage value;
 storing a result value of the multiplication-accumulation operation; and
 charge sharing the stored result values and converting the result values into digital values,
 wherein the operation of the local array is skipped based on the re-set input value.

9. The method of claim 8, wherein the predicted value is a result of performing the multiplication-accumulation operation on the weight and the input value, and
 wherein the re-setting of the input value includes, when the predicted value is "0", re-setting the input value to "0".

10. The method of claim 8, wherein the storing of the plurality of weights includes:
 storing a weight based on a weight pattern of a filter among the plurality of weights; and
 removing the weight when the weight pattern is repeated among the plurality of weights.

11. The method of claim 10, wherein the applying of the re-set input value to the local array further includes:
 adding at least one input value that is multiplied by the weight according to the weight pattern; and
 applying the added input value to the local array.

* * * * *